United States Patent [19]

Ocken et al.

[11] Patent Number: 5,179,501
[45] Date of Patent: Jan. 12, 1993

[54] LAMINATED ELECTRONIC MODULE ASSEMBLY

[75] Inventors: Alfred G. Ocken, Palatine; Nathan A. Unterman; Timothy S. Fisher, both of Chicago; Michael I. Petrites, Schaumburg, all of Ill.

[73] Assignee: Motorola, Inc., Schaumburg, Ill.

[21] Appl. No.: 840,247

[22] Filed: Feb. 24, 1992

[51] Int. Cl.⁵ .................................. H05K 7/20
[52] U.S. Cl. ........................ 361/388; 174/254; 361/395; 361/398; 439/76
[58] Field of Search ............... 165/80.3, 185; 174/252, 174/254, 35 R; 439/67, 76, 485; 29/829, 832, 846; 357/81; 361/383–388, 395, 398, 399, 424, 412, 413, 415

[56] References Cited

U.S. PATENT DOCUMENTS

| | | |
|---|---|---|
| 3,676,746 | 7/1972 | Kassabgi et al. . |
| 3,766,439 | 10/1973 | Isaacson . |
| 3,816,911 | 6/1974 | Knappenberger . |
| 3,971,127 | 7/1976 | Giguere ........................ 29/626 |
| 4,152,671 | 5/1979 | Tuma et al. . |
| 4,394,707 | 7/1983 | Consoli . |
| 4,495,546 | 1/1985 | Nakamura et al. . |
| 4,528,748 | 7/1985 | Eichelberger et al. . |
| 4,677,252 | 6/1987 | Takahashi ...................... 361/398 |
| 4,703,984 | 11/1987 | Mitchell, Jr. . |
| 4,792,879 | 12/1988 | Bauknecht et al. . |
| 4,811,165 | 3/1989 | Currier et al. . |
| 4,843,520 | 6/1989 | Nakatami ...................... 361/395 |
| 4,858,073 | 8/1989 | Gregory ......................... 361/388 |
| 4,922,059 | 5/1990 | Walker et al. . |
| 4,958,260 | 9/1990 | Kobayashi et al. . |
| 5,103,375 | 4/1992 | Cottingham .................. 361/398 |

FOREIGN PATENT DOCUMENTS 1519246  4/1967  France .
WO85/05756 12/1985  PCT Int'l Appl. .

Primary Examiner—Gerald P. Tolin
Attorney, Agent, or Firm—John H. Moore

[57] ABSTRACT

An electronic module assembly includes a relatively thin, bendable base plate having at least one bend axis along which the base plate is bent over on itself to provide an enclosure. An inner surface of the base plate supports at least one, and preferably two, relatively thicker metal plates, one on each side of the bend axis, each metal plate acting as a heatsink for circuit components mounted thereon.

12 Claims, 2 Drawing Sheets

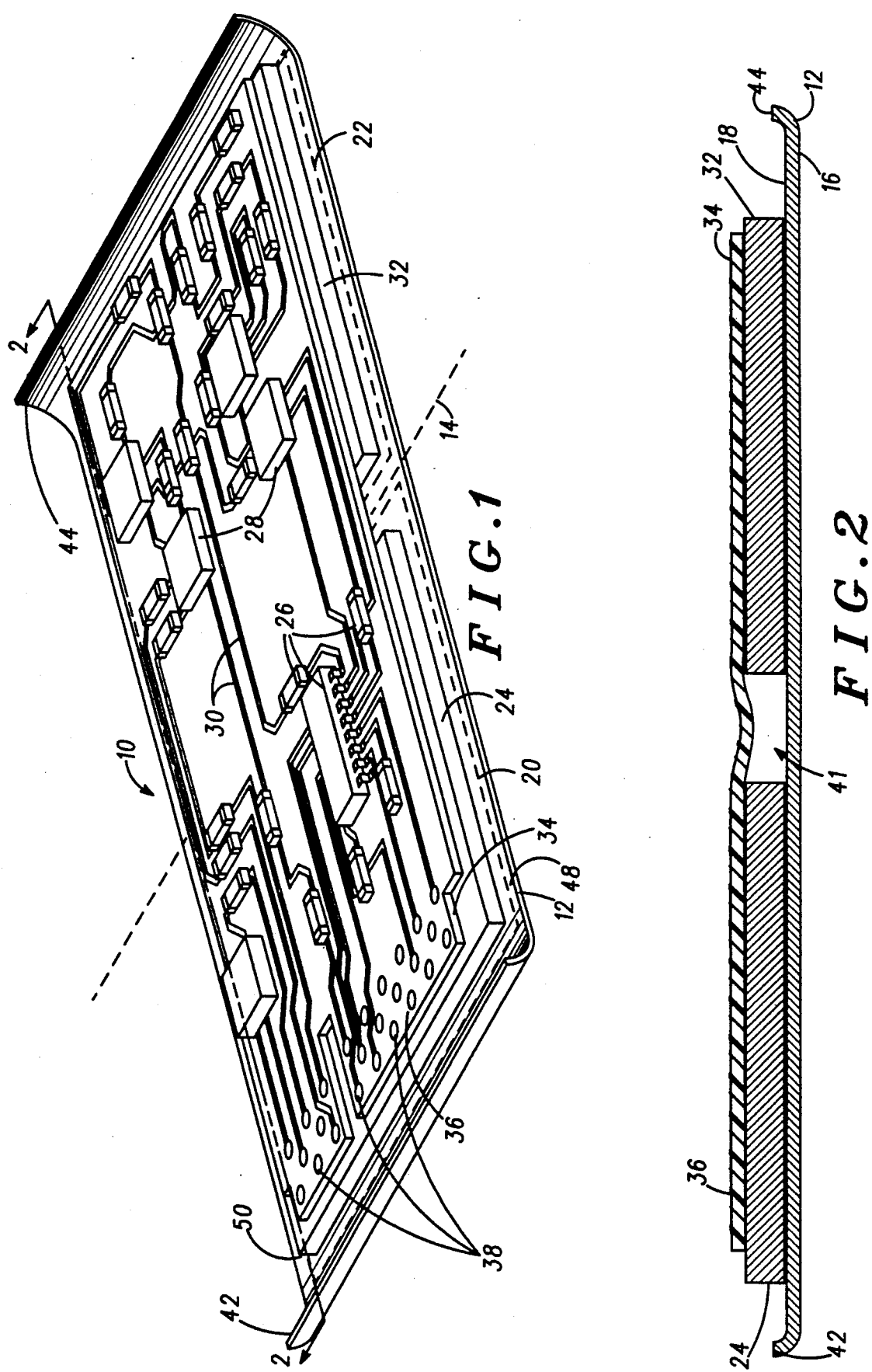

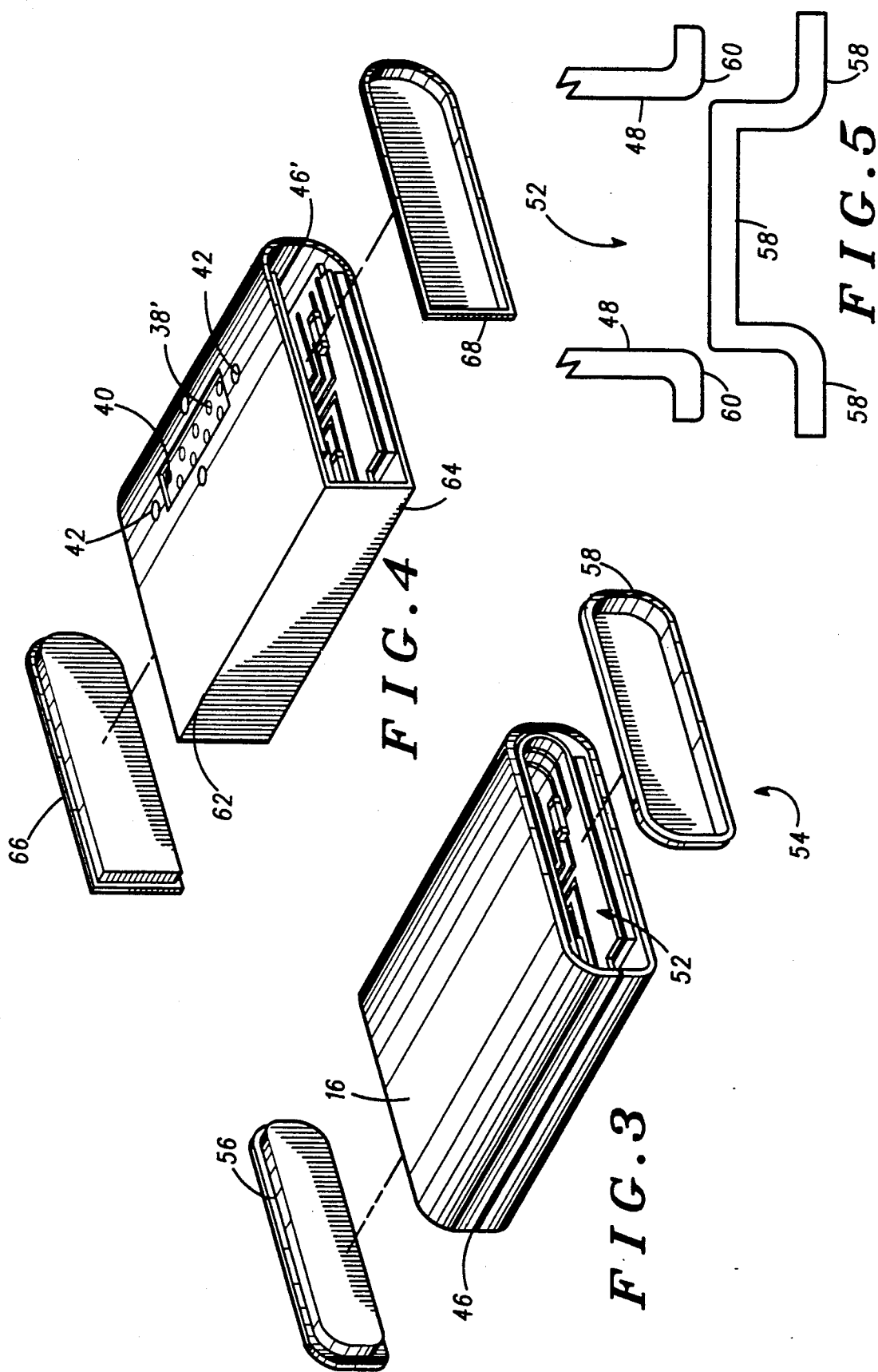

ial Nos. 5,179,501

LAMINATED ELECTRONIC MODULE ASSEMBLY

FIELD OF THE INVENTION

The present invention relates to electronic module assemblies, and particularly to the type of module assembly that includes an external housing that encloses electronic components situated within the housing.

BACKGROUND OF THE INVENTION

In the packaging of electronic components, it is frequently desirable to include many densely populated electronic components within a single enclosure or package. In a typical situation, the components are mounted on one or more supporting plates or substrates which are interconnected by wires or other forms of conductors. The substrates may then be sealed from the environment, as by using a conformal coating. The sealed assembly may then be enclosed within a rigid or semi-rigid housing to protect the enclosed components.

This conventional packaging technique tends to be undesirably expensive. In applications requiring relatively high power, the expense increases even more because the package may require internal or external heatsinks. A package that is robust, easily assembled, and less expensive is clearly desirable.

BRIEF DESCRIPTION OF THE DRAWINGS

FIG. 1 is a perspective view of an electronic module assembly according to the invention, showing the assembly prior to being folded into its ultimate configuration;

FIG. 2 is a cross-sectional view of the electronic module assembly depicted in FIG. 1 taken along section line 2—2;

FIG. 3 shows one way in which the FIG. 1 assembly may be folded over on itself, and further illustrating end caps for covering side apertures in the folded assembly;

FIG. 4 shows another way in which the FIG. 1 assembly may be folded over on itself, and further illustrating end caps for covering side apertures in the folded assembly; and FIG. 5 is a diagrammatical view showing how a peripheral edge of the folded assemblies of FIG. 3 or 4 may be formed to join mating peripheral edges of the end caps.

DESCRIPTION OF THE PREFERRED EMBODIMENT

Referring to FIG. 1, an electronic module assembly 10 is shown at an intermediate stage of its construction. This assembly includes a relatively thin base plate 12 which may be formed from aluminum plate having a thickness of 13 mils, for example. The purpose of the base plate is to provide a robust, yet easily bendable support for electronic components that are mounted thereon. At a later stage of construction, the base plate will be bent over on itself to form an enclosure for the components that it supports. A bend axis 14 is shown which indicates where the base plate may be bent over on itself to form the enclosure.

As shown best in FIG. 2, the base plate 12 has an outer surface 16 and an inner surface 18. This inner surface 18 has a first circuit component area that is identified by the dashed line 20 (FIG. 1) and that is located on one side of the bend axis 14. A second circuit component area 22 is located on the inner surface 18 of the base plate 12 and situated on the opposite side of the bend axis 14. Each circuit component area is intended to carry electronic circuit components, heatsinks, or any combination thereof.

Referring to the first circuit component area 20, this area carries at least one thick metal plate that is mounted on the inner surface 18 of the base plate. In the illustrated embodiment, a single, relatively thick (as compared to the thickness of the base plate 12) metal plate 24 occupies most of the circuit component area 20. The bottom surface of the metal plate 24 is bonded to the inner surface 18 of the base plate 12, while the top surface of the metal plate 24 supports electronic components 26. With this arrangement, the relatively thick metal plate 24 acts as a heatsink for the components 26.

It is contemplated that the second circuit component area 22 will have additional circuit components 28 situated there, and that conductors 30 will extend from the circuit components 26 (situated at the first circuit component area 20) to the circuit components 28 (situated at the second circuit component area 22). In the preferred embodiment, a second, relatively thick metal plate 32 (not necessarily the same thickness as the plate 24) is mounted via its bottom surface to the inner surface 18 of the base plate 12. The top surface of the plate 32 supports the circuit components 28 so that the plate 32 acts as a heatsink for components 28.

Preferably, the components 26 and 28 are mounted directly on a thin, flexible insulating film 34 (e.g., polyimide) on which various metal interconnects (including the conductors 30) are formed. One end 36 of the film 34 carries apertures 38 which can mate with pins in an electrical connector (not shown) to establish conductive paths between the circuit elements 26, 28, and the external world. To mate the non-illustrated connector pins with the apertures 38, a through hole (not shown in FIGS. 1 and 2) is formed in the base plate 12 and in the metal plate 24 such that the through hole is immediately below the apertures 38. Referring briefly to FIG. 4, such a through hole 40 is shown. It permits a male connector to mate with apertures 38' that are formed in an insulating film such as 34 (FIG. 1). Holes 42 (FIG. 4) may be included for receiving fasteners to hold a connector to the assembly shown in FIG. 4.

Referring to FIG. 1 again, the bottom surface of the insulating layer 34 is preferably bonded by heat-conductive adhesive to the underlying surfaces of the plates 24 and 32. However, the bottom surface of insulating layer 34 that crosses the bend axis 14 is not bonded to either plate 20, 32 or to the base plate 12. Thus, as shown in FIG. 2, the portion of the insulation layer that overlies the gap 41 is left unbonded. This allows the unbonded portion of the insulating layer to freely flex when the base plate is bent over on itself.

Still referring to FIG. 1, the illustrated assembly 10 will be bent over on itself along the bend axis 14 such that one edge 42 of the base plate 12 abuts the edge 44 at the opposite end of the base plate. The resulting, semi-enclosed structure is shown in FIG. 3 wherein the mating edges 42 and 44 meet at a seam 46.

Returning to FIG. 1 again, it can be seen that the surface area of the relatively thick metal plate 24 has a surface area that is smaller than the surface area of the base plate 12 so that peripheral portions 48 and 50 of the base plate are left uncovered by the plate 24. Similar peripheral portions of the base plate are left uncovered by the plate 32. As will be explained, these peripheral portions are deliberately left uncovered so that they may be conveniently used in completing the enclosure for the circuit components 26 and 28.

Referring to FIG. 3 again, it can be seen that the outer surface 16 of the base plate 12 now forms the exterior of an enclosure for the components contained within. To complete the enclosure, the seam 46 may be welded closed, and the side apertures (e.g., aperture 52) that are formed by folding the base plate are preferably covered by end caps 54, 56. Each end cap has a peripheral portion 58 which is preferably joined to mating peripheral portions of the base plate, i.e. peripheral portions 48 and 50 of FIG. 1.

The way in which the end caps 54 and 56 are preferably joined to the base plate is shown schematically in FIG. 5. The numerals 48 identify the peripheral portions 48 of the base plate after they have been formed to have flanges 60. The numeral 58 identifies the peripheral portion 58 of the end cap 54. To join the end cap 54 to the base plate 12, the end cap 58 is firmly inserted into the aperture 52, and the peripheral portion 58 of the end cap 54 is folded over the flanges 60 to provide a tight seal for the assembly.

Some of the advantages of the invention flow directly from the fact that the illustrated structure allows the base plate 12 to be relatively thin. This thinness allows the base plate to be easily bent into the shape shown in FIG. 3 without developing a significant amount of "spring back" force. The thinness of the base plate 12 does not, however, limit or detract from the heatsinking capability of the assembly because that function is provided by the relatively thicker plate 24 and/or plate 32. The result is a laminated structure that has the heatsinking capability, as needed, of a more massive structure without the forming difficulties associated with structures using more massive base plates.

This also permits the peripheral edges 48, 50 to also be thin enough to be relatively easily formed and joined with end caps 54 and 56.

The embodiment shown in FIG. 3 illustrates one way in which the assembly 10 (FIG. 1) may be bent over on itself. The FIG. 3 embodiment results when the base plate 12 is provided with a single, continuous bend of about 180 degrees. The assembly 10 may however, be bent over on itself by using multiple (two or more) levels which cumulatively allow the base plate to be bent over on itself about 180 degrees. An example which uses two separate bends of about 90° each is shown in FIG. 4. Two bend lines 62, 64 are used to close the assembly and form a seam 46' which may be sealed by welding. End caps 66 and 68, provided to completely seal the assembly, may be formed and joined to the peripheral portions of the base plate as already described.

Although the invention has been described in terms of preferred structure, it will be obvious to those skilled in the art that various alterations and modifications may be made without departing from the invention. Accordingly, it is intended that all such modifications and alterations be considered as within the spirit and scope of the invention as defined by the appended claims.

What is claimed is:

1. A laminated electronic module assembly, comprising:
    a relatively thin base plate having at least one bend axis along which the base plate is bent over on itself to provide a cavity that is enclosed above and below by first and second, substantially parallel, interior surfaces of the bent base plate, at least one of said interior surfaces defining a first circuit component area located within the cavity and on one side of the bend axis;
    at least one un-bent metal plate that is thicker than the thin base plate, the metal plate being mounted within the cavity at the first circuit component area, the metal plate acting as a heatsink for one or more circuit components to be mounted thereon; and
    circuit components mounted on the relatively thicker metal plate.

2. A laminated electronic module assembly as set forth in claim 1 wherein the other of the interior surfaces of the base plate has a second circuit component area located on an opposite side of the bend axis and further including:
    additional circuit components situated in the second circuit component area; and
    conductors extending from the circuit components mounted on the un-bent, relatively thicker metal plate to the additional circuit components.

3. A laminated electronic module assembly as set forth in claim 2 further including a second relatively thicker metal plate mounted on said other interior surface of the base plate at the second circuit component area for supporting the additional circuit components.

4. A laminated electronic module assembly as set forth in claim 1 wherein the relative thicker metal plate is selected to have a surface area that is smaller than the thin base plate's surface area such that, upon mounting the relatively thick metal plate at the first circuit component area, a peripheral portion of the base plate is left uncovered by the relatively thick metal plate so that said peripheral portion may be more readily formed to assist in enclosing the circuit components.

5. A laminated electronic module assembly comprising:
    a relatively thin base plate having at least one bend axis along which the base plate is bent over on itself to provide an inner surface and an outer surface, the inner surface having at least a first circuit component area located on one side of the bend axis;
    at least one relatively thick metal plate mounted on the inner surface of the base plate at the first circuit component area, the metal plate acting as a heatsink for one or more circuit components to be mounted thereon; and
    circuit components mounted on the relatively thick metal plate,
    wherein the thick metal plate is selected to have a surface area that is smaller than the base plate's surface area such that, upon mounting the relatively thick metal plate at the first circuit component area, a peripheral portion of the base plate is left uncovered by the relatively thick metal plate so that said peripheral portion may be more readily formed to assist in enclosing the circuit components,
    wherein the thin base plate has first and second ends which are adjacent to each other after the base plate has been bent, and wherein the ends are sealed together.

6. A laminated electronic module assembly comprising:
    a relatively thin base plate having at least one bend axis along which the base plate is bent over on itself to provide an inner surface and an outer surface, the inner surface having at least a first circuit component area located on one side of the bend axis;

at least one relatively thick metal plate mounted on the inner surface of the base plate at the first circuit component area, the metal plate acting as a heat-sink for one or more circuit components to be mounted thereon, the relatively thick metal plate being selected to have a surface area that is smaller than the base plate's surface area such that, upon mounting the relatively thick metal plate at the first circuit component area, a peripheral portion of the base plate is left uncovered by the relatively thick metal plate so that said peripheral portion may be more readily formed to assist in enclosing the circuit components; and a pair of side apertures formed by the bent base plate and bounded by peripheral portions of the base plate, and further including a pair of end caps for covering the apertures, the end caps having peripheral portions that are joined to the peripheral portions of the base plate.

7. A laminated electronic module assembly as set forth in claim 2, further including a flexible, insulating film carrying circuit components that are situated in the first and second circuit component area, the insulating film being bonded to the relative thicker metal plate and extending from the first circuit component area to the second circuit component area.

8. A laminated electronic module assembly as set forth in claim 7 wherein the insulating film extends over the bend axis of the base plate, and wherein the portion of the insulating film that crosses the bend axis is not bonded to the base plate.

9. A laminated module assembly as set forth in claim 1 wherein the thin base plate has multiple bend axes along which the thin base plate is bent over on itself to provide a cumulative bend of about 180 degrees.

10. A laminated electronic module assembly as set forth in claim 1 wherein the thin base plate has two separate bends of about 90 degrees each.

11. A laminated electronic module assembly as set forth in claim 1 wherein the thin base plate has a single, continuous bend of about 180 degrees.

12. A laminated electronic module assembly, comprising:

a relatively thin base plate having at least one bend axis along which the base plate is bent over on itself to provide an inner surface and an outer surface, the inner surface having first and second circuit component area, one such area being located on each side of the bend axis;

a first un-bent metal plate that is thicker than the thin base plate, the un-bent metal plate having a bottom surface that is mounted on the inner surface of the base plate at the first circuit component area, and having a top surface;

a second un-bent metal plate that is thicker than the thin base plate, the second un-bent metal plate having a bottom surface that is mounted on the inner surface of the thin base plate at the second circuit component area, and having a top surface;

a flexible, continuous insulating film having a first portion that is bonded to the top surface of the first un-bent metal plate, a second portion that is bonded to the top surface of the second un-bent metal plate, and a middle, unbonded portion that overlies the bend axis and that electronically couples the first portion to the second portion; and circuit components mounted on the first and second portions of the insulating film.

* * * * *